United States Patent [19]

Takeda et al.

[11] Patent Number: 4,898,837
[45] Date of Patent: Feb. 6, 1990

[54] METHOD OF FABRICATING A SEMICONDUCTOR INTEGRATED CIRCUIT

[75] Inventors: Kazuo Takeda; Nobuyuki Sekikawa; Katsuhiro Hayasaka; Chikao Fujunuma; Nobuo Itoh; Tetsuya Kubota, all of Gunma, Japan

[73] Assignee: Sanyo Electric Co., Ltd., Osaka, Japan

[21] Appl. No.: 271,748

[22] Filed: Nov. 15, 1988

[30] Foreign Application Priority Data

Nov. 19, 1987 [JP] Japan ................................ 62-292415
Nov. 19, 1987 [JP] Japan ................................ 62-292416
Nov. 19, 1987 [JP] Japan ................................ 62-292420
Dec. 17, 1987 [JP] Japan ................................ 62-320337
Dec. 25, 1987 [JP] Japan ................................ 62-331176

[51] Int. Cl.[4] .......................................... H01L 21/265
[52] U.S. Cl. ..................................... 437/31; 437/47; 437/27; 437/918; 357/51
[58] Field of Search ............... 437/31, 32, 33, 917, 437/918, 27, 47; 148/DIG. 10; 357/23.4, 34, 51

[56] References Cited

U.S. PATENT DOCUMENTS

| 4,021,270 | 5/1977 | Hunt et al. | 437/31 |
| 4,025,364 | 5/1977 | Smith | 437/31 |
| 4,155,778 | 5/1979 | Antipov | 437/33 |
| 4,196,228 | 4/1980 | Priel et al. | 437/918 |
| 4,233,615 | 11/1980 | Takemoto et al. | 357/51 |
| 4,416,055 | 11/1983 | McCarthy et al. | 437/31 |
| 4,418,469 | 12/1983 | Fujita | 437/31 |

FOREIGN PATENT DOCUMENTS

| 0128860 | 10/1980 | Japan | 357/51 |
| 0054058 | 5/1981 | Japan | 357/51 |
| 0056663 | 5/1981 | Japan | 357/51 |
| 0155750 | 9/1983 | Japan | 357/51 |

Primary Examiner—Brian E. Hearn
Assistant Examiner—Tuan Nguyen
Attorney, Agent, or Firm—Darby & Darby

[57] ABSTRACT

A method of fabricating a semiconductor integrated circuit comprises the steps of: forming buried layers in predetermined regions of a semiconductor substrate; forming an epitaxial layer covering the substrate and the buried layers; forming isolation regions dividing the epitaxial layer into a plurality of islands; selectively implanting ions to form a base region of a vertical bipolar transistor in a surface layer of one island and simultaneously to form a resistor region in a surface layer of another island; and selectively diffusing impurities into a surface layer of the base region, to form an emitter region of the vertical bipolar transistor.

13 Claims, 7 Drawing Sheets

METHOD OF FABRICATING A SEMICONDUCTOR INTEGRATED CIRCUIT

BACKGROUND OF THE INVENTION

1. Field of the Invention

The present invention relates to a method of fabricating a semiconductor IC (integrated circuit) including a bipolar transistor and a resistor, and particularly to an accurate control of a current amplification factor $h_{FE}$ of the bipolar transistor.

2. Description of the Prior Art

Generally, a bipolar semiconductor IC comprises a vertical npn transistor. In forming the npn transistor, a base region is formed by impurity diffusion in a surface layer of a collector region and an emitter region is formed by impurity diffusion in a surface layer of the base region. Thus, in fabrication of the bipolar type semiconductor IC, the steps of forming the base and emitter regions by diffusion are indispensable fundamental steps of fabrication. In addition, the step of forming buried layers of a high impurity concentration for decreasing electrical resistance of the collector, the step of growing an epitaxial layer, the step of forming junction isolation regions for isolating circuit elements, and the step of forming electrodes for electrical connection are also fundamental steps indispensable for fabrication of the bipolar semiconductor IC.

On the other hand, in a bipolar semiconductor IC, it is often necessary to form, other than the npn transistor, a pnp transistor, a resistor, a capacitor, a Zener diode and the like on the same substrate. In order to avoid complexity of fabrication processes, it is desirable to form such circuit elements concurrently in any of the above described fundamental steps as far as possible. However, since the conditions of the above described fundamental fabrication steps are selected to obtain optimum characteristics of the npn transistor, it is often difficult to incorporate other circuit elements concurrently by using only the fundamental fabrication steps. Accordingly, new steps other than the above described fundamental fabrication steps are sometimes adopted to form other circuit elements than the npn transistor or to improve characteristics of such circuit elements.

Such additional steps are for example as follows: a p+ diffusion step of forming an anode region in addition to the cathode region of the Zener diode formed concurrently in the same step as the diffusion step of forming the emitter of the npn transistor, a diffusion step or an ion implantation step of forming a resistor region having a specific resistance different from that of the base region of the npn transistor, a step of forming a nitride layer as a dielectric layer of a capacitor having a capacitance larger than that of a MOS (metal oxide semiconductor) capacitor, and a step of forming a collector region of low resistance for lowering the collector resistance of the npn transistor. Those additional steps are optional steps to be adopted in view of the applications or purposes for which the bipolar IC is used or the manufacturing cost thereof.

Referring to FIG. 1, there is shown a schematic sectional view of a semiconductor IC including a vertical npn transistor and a resistor formed by using some of the above described optional steps. Buried layer 2 of n+ type are formed on a p type semiconductor substrate 1. The substrate 1 and the buried layers 2 are covered with an n type epitaxial layer 3. The epitaxial layer 3 is divided into islands 5 as regions for forming circuit elements, by p+ type isolation regions 4. A base region 6, an emitter region 7 and a collector contact region 8 of an npn transistor are formed in a surface layer of an island 5. A resistor region 9 and contact regions 10 are formed in a surface layer of another island 5. The resistor region 9 is formed by ion implantation after the base region 6 has been formed by diffusion.

The semiconductor IC as shown in FIG. 1 is described for example in Japanese Patent Publication No. 2182/1982.

However, when the resistor region 9 formed by ion implantation is annealed, the impurity in the base region 6 is unavoidably diffused to a certain extent. Accordingly, it is difficult to accurately control a current amplification factor $h_{FE}$ of the npn transistor.

In addition, it is necessary to change heat treatment conditions for forming the base region dependently on whether the optional step of forming the resistor 9 by ion implantation is adopted or not. In other words, it is also necessary to change conditions in the above described fundamental steps for a semiconductor IC to be fabricated by using optional steps.

SUMMARY OF THE INVENTION

In view of the above described prior art, an object of the present invention is to provide a method of fabricating a semiconductor IC including a bipolar transistor and a resistor and making it possible to accurately control a current amplification factor $h_{FE}$ of the bipolar transistor.

According to an aspect of the present invention, a method of fabricating a semiconductor IC comprises the steps of: preparing a semiconductor substrate of a first conductivity type; forming buried layers of a second conductivity type opposite to the first conductivity type in predetermined regions of the semiconductor substrate; forming an epitaxial layer of the second conductivity type covering the substrate and the buried layers; forming isolation regions of the first conductivity type for dividing the epitaxial layer into a plurality of islands; implanting ions selectively to form a base region of the first conductivity type of a vertical bipolar transistor in a surface layer of one island and simultaneously to form a resistor region in a surface layer of another island; and selectively diffusing impurities of the second conductivity type into the surface layer of the base region to form an emitter region of the vertical bipolar transistor.

According to another aspect of the present invention, a method of fabricating a semiconductor integrated circuit comprises the steps of: preparing a semiconductor substrate of a first conductivity type; forming buried layers of a second conductivity type opposite to the first conductivity type in predetermined regions of the semiconductor substrate; forming an epitaxial layer of the second conductivity type covering the substrate and the buried layers; forming isolation regions of the first conductivity type for dividing the epitaxial layer into a plurality of islands; forming an insulator film on the epitaxial layer; forming a first resist pattern on the insulator film; selectively applying dry etching to the insulator film by using the first resist pattern to form an insulator film pattern; selectively introducing impurities of the first conductivity type by first ion implantation to form a base region of a vertical bipolar transistor and a resistor region simultaneously; forming a second resist pattern over the insulator film pattern; selectively introducing impurities of the first conductivity type by second ion implantation by using at least the insulator film pattern and the second resist pattern as masks to increase an impurity concentration of the base region of the vertical bipolar transistor to a value larger than the impurity concentration of the resistor region and to diffuse the impurities in the base region to a predetermined depth; and selectively diffusing impurities of the second conductivity type from a surface of the epitaxial layer to form an emitter region of the vertical bipolar transistor.

According to a further aspect of the present invention, a method of fabricating a semiconductor IC comprises the steps of: preparing a semiconductor substrate of a first conductivity type; forming buried layers of a second conductivity type opposite to the first conductivity type in predetermined regions of the semiconductor substrate; forming an epitaxial layer of the second conductivity type covering the substrate and the buried layers; forming isolation regions of the first conductivity type by thermal diffusion for dividing the epitaxial layer into a plurality of islands; removing a thick oxide layer formed unavoidably on the epitaxial layer at the time of forming the isolation regions, to expose the epitaxial layer and forming another thin thermal oxide layer on the epitaxial layer; selectively implanting ions through the thin thermal oxide layer to form a resistor region in a surface layer of one island and at the same time to form a base region of a vertical bipolar transistor in a surface layer of another island; diffusing the impurities in the base region to a predetermined depth by heat treatment; selectively diffusing impurities of the second conductivity type into a surface layer of the base region to form an emitter region of the vertical bipolar transistor in a predetermined depth.

According to a further aspect of the present invention, a method of fabricating a semiconductor IC comprises the steps of: preparing a semiconductor substrate of a first conductivity type; forming buried layers of a second conductivity type opposite to the first conductivity type in predetermined regions of the semiconductor substrate; forming an epitaxial layer of the second conductivity type covering the substrate and the buried layers; forming isolation regions of the first conductivity type dividing the epitaxial layer into a plurality of islands; forming an insulator film on the epitaxial layer; forming a first resist pattern on the insulator film; selectively applying dry etching to the insulator film by using the first resist pattern to form an insulator film pattern; selectively introducing impurities of the first conductivity type by first ion implantation using at least the insulator film pattern as a mask, thereby to form first and second resistor regions; forming a second resist pattern over the insulator film pattern; and selectively introducing impurities of the first conductivity type by second ion implantation using at least the insulator film pattern and the second resist pattern as masks, thereby to increase an impurity concentration of the second resistor region to a value larger than that of the first resistor region.

The foregoing and other objects, features, aspects and advantages of the present invention will become more apparent from the following detailed description of the present invention when taken in conjunction with the accompanying drawings.

BRIEF DESCRIPTION OF THE DRAWINGS

In the drawings, the same reference characters denote corresponding portions.

DESCRIPTION OF THE PREFERRED EMBODIMENTS

FIGS. 2A to 2H illustrate a method of fabricating a semiconductor IC according to an embodiment of the present invention.

Figure 1:
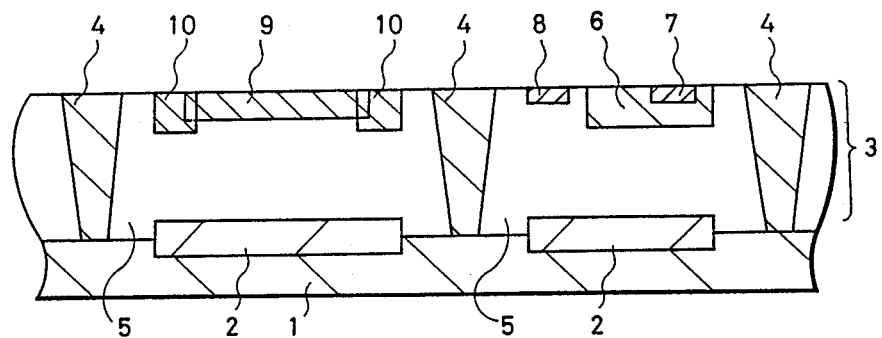
FIG. 1 is a sectional view schematically illustrating a semiconductor IC formed by a prior art method.
Figure 2A:
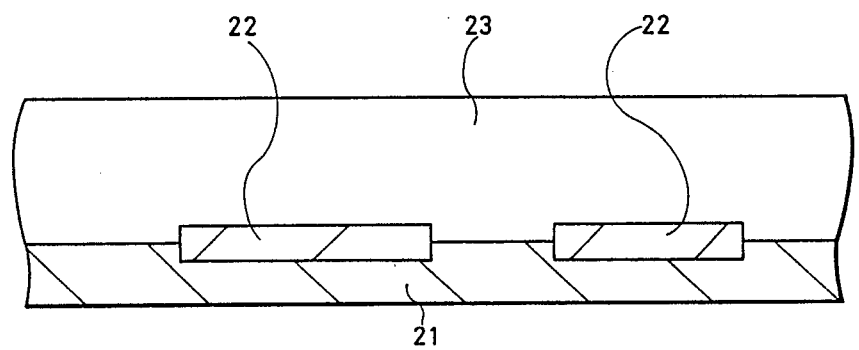
FIGS. 2A to 2H are sectional views schematically showing a method of fabricating a semiconductor IC according to an embodiment of the present invention.

Referring to FIG. 2A, a surface layer of a semiconductor substrate 21 of p type silicon or the like is selectively doped with n type impurities such as antimony or arsenic, whereby n+ type buried layers 22 are formed. Then, an n type epitaxial layer 23 of 5 $\mu$m to 10 $\mu$m in thickness is grown to cover the buried layers 22 and the substrate 21.

Figure 2B:
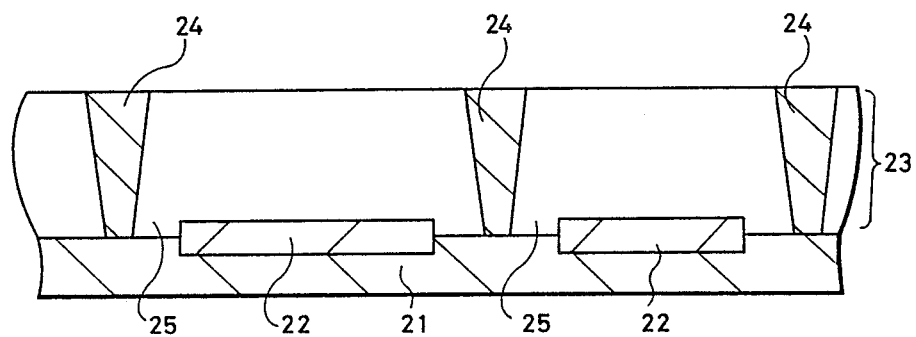

Referring to FIG. 2B, boron is selectively diffused from a surface of the n type epitaxial layer 23 to form p+ type isolation regions 24, by which the epitaxial layer 23 is divided into a plurality of islands 25.

Figure 2C:
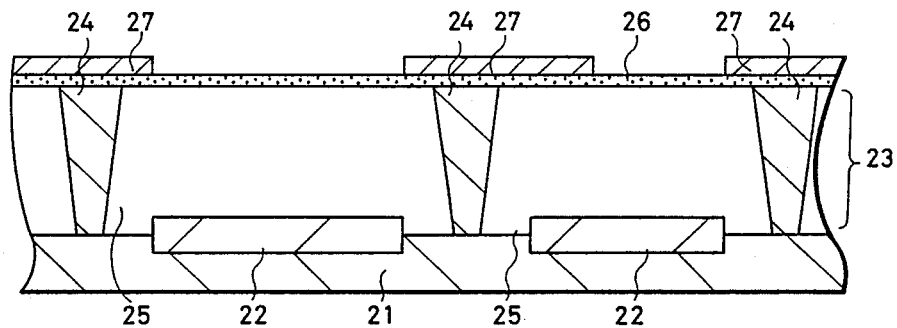

Referring to FIG. 2C, a thermal oxide layer 26 is formed on the epitaxial layer 23. The oxide layer 26 is coated with photoresist of a positive or negative type by a spin-on method. The photoresist layer thus formed is exposed to light and developed by using an exposure apparatus of a reflection and projection type or a reduction and projection type having an alignment precision of 1 $\mu$m or less, whereby a first resist pattern 27 is formed.

Figure 2D:
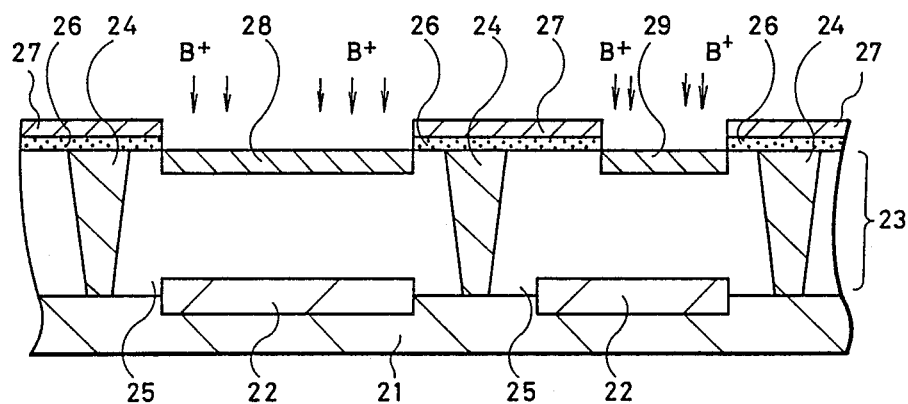

Referring to FIG. 2D, the oxide layer 26 is anisotropically etched by a process of dry etching such as reactive ion etching using the first resist pattern 27 as a mask. After that, the first resist pattern 27 is removed or left and in this state, boron is selectively introduced into the epitaxial layer 23 by first implantation, whereby a resistor region 28 and a base region 29 of an npn transistor are formed on the respective islands. In the first ion implantation, a dose of boron ions and a voltage for acceleration thereof are selected to obtain an impurity concentration suitable for the resistor region 28 having a relatively high specific resistance.

Figure 2E:
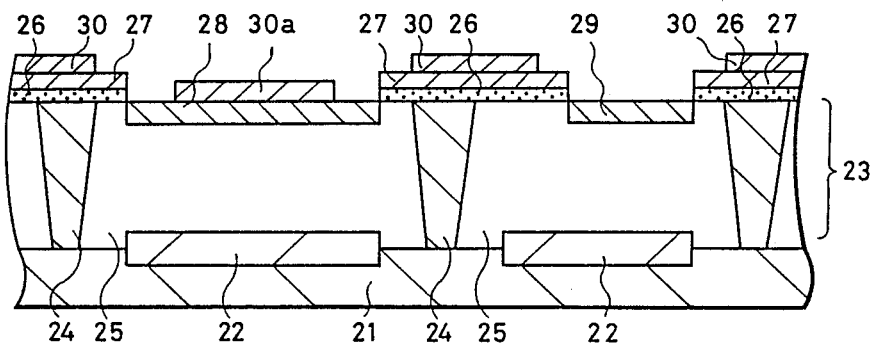

Referring to FIG. 2E, a second photoresist layer of the negative type is formed by the spin-on method on the first resist pattern 27 and the epitaxial layer 23, or on the oxide layer pattern 26 after removal of the first resist pattern 27 and the epitaxial layer 23. The second photoresist layer is subjected to exposure and development by a proximity exposure method or a projection exposure method. As a result, second resist pattern 30, 30a is formed. Since the first resist pattern 27 or the oxide layer pattern 26 exists under the second resist pattern 30, each opening of the second resist pattern may be a little larger than that of the first resist pattern 27. In other words, a high precision is not required for alignment of the second resist pattern 30. A portion 30a of the second resist pattern directly covers the surface of the resistor region 28 excluding both end portions of the resistor region 28.

Figure 2F:
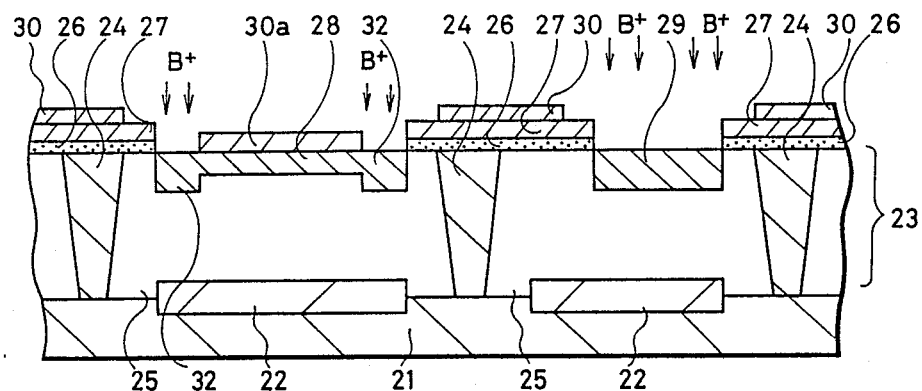

Referring to FIG. 2F, boron ions are introduced into the base region 29 and the contact portions 32 at both ends of the resistor region 28 by second ion implantation using the second resist pattern 30, 30a, the first resist pattern 27 and the oxide layer pattern 26 as masks. In the second ion implantation, a dose of boron ions and a voltage for acceleration thereof are selected to obtain an impurity concentration suited for the base region 29. The impurity concentration suited for the base region 29 is an impurity concentration sufficient for the contact regions 32 of the resistor 28 to form ohmic contact with metal electrodes. After that, the first and second resist patterns 27, 30 and 30a are removed and the whole surface of the epitaxial layer 23 is covered with an oxide layer 26 by a thermal oxidation or CVD (Chemical Vapor Deposition) process and the impurity in the base region 29 is diffused to a predetermined depth by a heat treatment.

In the second ion implantation, it does not matter whether the first resist pattern 27 is left or not. However, if the first resist pattern 27 remains, there are advantages that the step of removing the first resist pattern can be omitted and the oxide layer 26 thereunder may have a thin thickness.

Figure 2G:
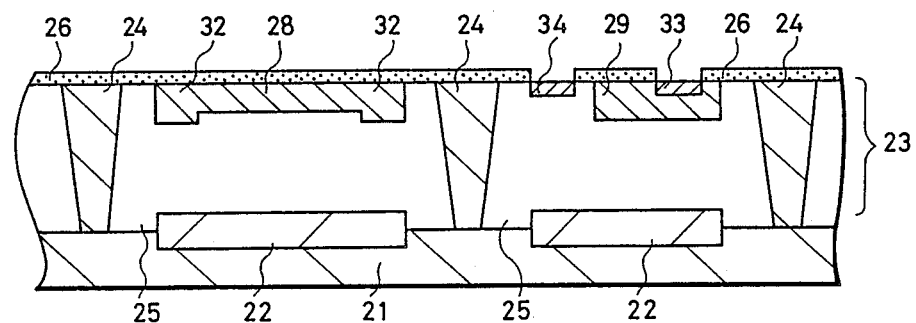

Referring to FIG. 2G, the oxide layer 26 is patterned on the island 25 where an npn transistor is to be formed. A liquid source containing phosphorus for example is laid by the spin-on method to cover the patterned oxide layer 26 and it is baked, whereby phosphorus diffusion seeds are formed on the surface layer of the emitter region 33 and the surface layer of the collector contact region 34. After the phosphorus silicate glass film formed by the baking is removed, phosphorus is driven in from the diffusion seeds by a heat treatment in an oxidizing or non-oxidizing atmosphere, whereby the emitter region 33 and the collector contact region 34 are completed.

Figure 2H:
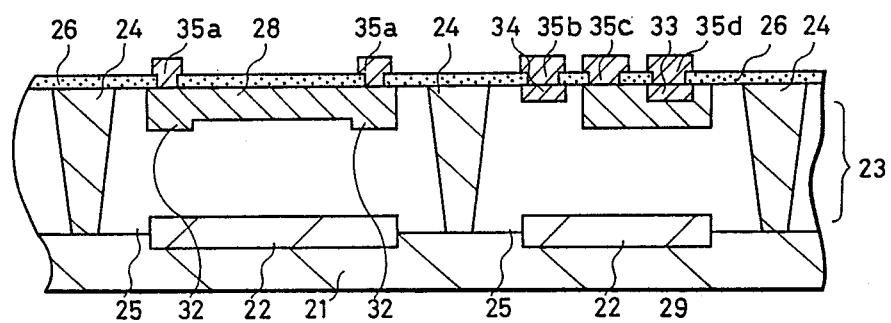

Referring to FIG. 2H, the oxide layer 26 is further patterned. The patterned oxide layer 26 and its openings are covered with an aluminum layer deposited by evaporation or sputtering. The aluminum layer is patterned to form electrodes 35a on the contact regions 32, a collector electrode 35b on the collector contact region 34, a base electrode 35c on the base region 29, and an emitter electrode 35d on the emitter region 33.

Figure 3:
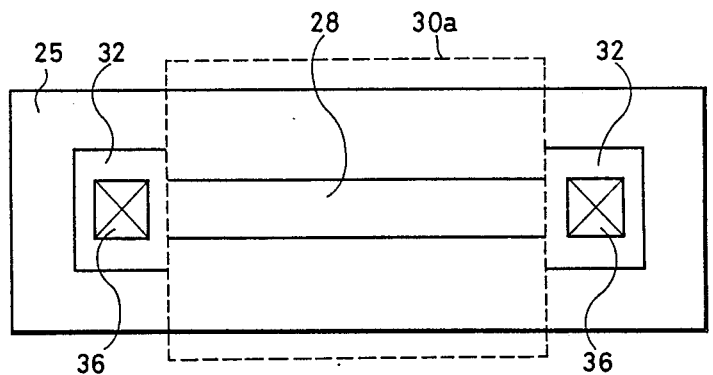
FIG. 3 is a schematic plan view of a resistor region in the semiconductor IC of FIG. 2H.

FIG. 3 shows a plan view of the island 25 including the resistor in the semiconductor IC shown in FIG. 2H. A contact hole 36 is formed in each contact region 32. Since each of the contact regions 32 has a sufficient low specific resistance, the resistance value of the resistor 28 is determined by a length and a width of the resistor region 28 sandwiched by the two contact regions. The width of the resistor region 28 is controlled substantially by the first resist pattern 27 and the length thereof is controlled substantially by the portion 32a of the second resist pattern.

In the above described embodiment, a heat treatment suited for annealing of the base region 29 is applied after implantation of ions into the resistor region 28 and the base region 29. Accordingly, the base region 29 is not adversely affected by annealing for the resistor region 28 as in the prior art. Thus, the current amplification factor $h_{FE}$ of the bipolar transistor can be accurately controlled. In addition, the annealing conditions for the base region 29 can be used in common irrespective of whether the resistor is incorporated in the semiconductor IC or not. In other words, semiconductor ICs of different types can be annealed in the same furnace. In addition, since the resistor region 28 and the base region 29 are formed by ion implantation, those regions can be formed substantially with a photoetching precision. Furthermore, since the resistor region 28 and the base region 29 are formed simultaneously, the manufacturing process can be simplified.

Figure 4:
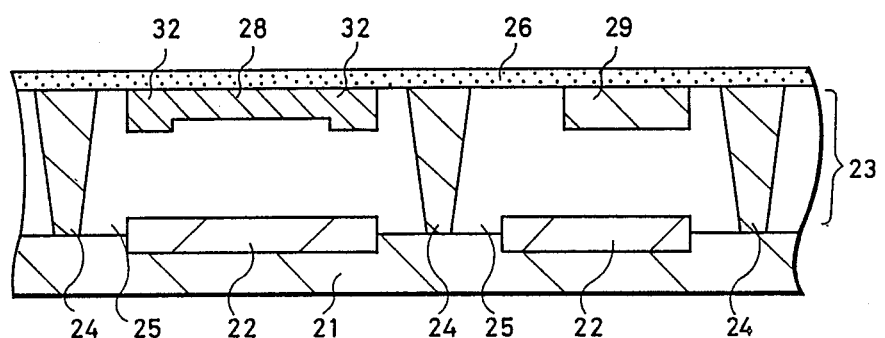
FIG. 4 is a sectional view illustrating another embodiment of the present invention.

Referring to FIG. 4, another embodiment of the present invention is illustrated. In this embodiment, the first and second resist patterns 27, 30 and 30a are removed after the steps shown in FIGS. 2A to 2F and the whole surface of the epitaxial layer 23 is covered with an oxide layer 26 having a thickness of about several thousands Å by using a CVD process or the like under the normal pressure. After that, the impurities in the base region 29 is diffused to a predetermined depth by a heat treatment at about 1000° C. in a non-oxidizing atmosphere. If the heat treatment is applied in the non-oxidizing atmosphere, the impurity concentration in the surface layer of the base region 29 or the resistor region 28 is less lowered as compared with the case of a heat treatment in an oxidizing atmosphere. Consequently, the depths and the impurity concentrations of the base region 29 and the resistor region 28 can be controlled accurately. In addition, if the heat treatment is applied in the non-oxidizing atmosphere, generation of crystal defects due to damages caused by the ion implantation is decreased as compared with the case of a heat treatment in an oxidizing atmosphere. Accordingly, change in the current amplification factor $h_{FE}$ of the npn transistor due to crystal defects can be also suppressed. After that, the steps of FIGS. 2G and 2H are executed and thus fabrication of the semiconductor IC is completed.

FIGS. 5A to 5E illustrate a further embodiment of the present invention.

Figure 5A:
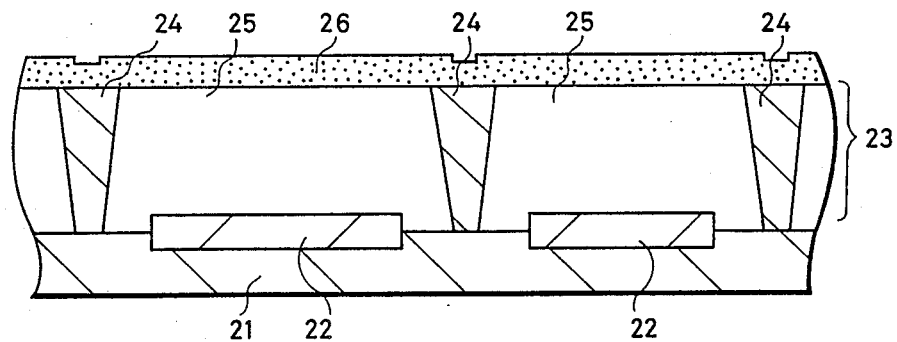
FIGS. 5A to 5E are sectional views illustrating a further embodiment of the present invention.

Referring to FIG. 5A, after $n^+$ type buried layers 22 and an n type epitaxial layer 23 are formed on a p type semiconductor substrate 21, boron is selectively diffused from the top surface of the epitaxial layer 23, so that isolation regions 24 for dividing the epitaxial layer 23 into a plurality of islands 25 are formed. Since diffusion of boron continues for a long period in an oxidizing atmosphere, a thick oxide layer 26 of 5000 Å to 8000 Å in thickness is formed on the surface of the epitaxial layer 23. This thick oxide layer 26 is completely removed by 10% HF solution and the surface of the epitaxial layer 23 is exposed.

Figure 5B:
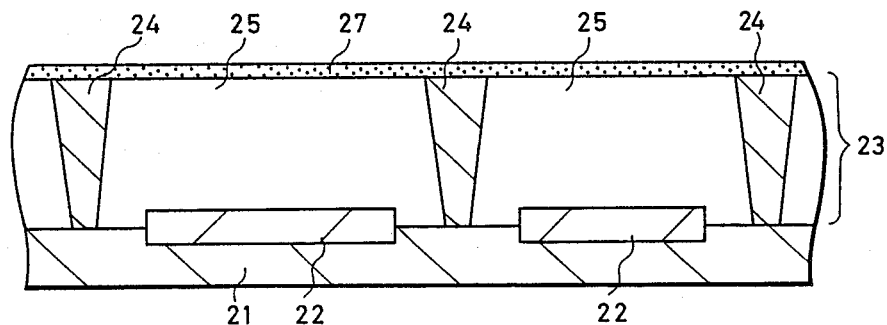

Referring to FIG. 5B, the exposed surface of the epitaxial layer 23 is thermally oxidized again and a thin oxide layer 26 of about several hundreds Å to 1000 Å in thickness is formed thereon. Since shallow grooves formed at the time of depositing boron seeds for formation of the isolation regions 24 remain on the surface of the epitaxial layer 23, shallow grooves appear also on the surface of the thin oxide layer 26. Accordingly, those shallow grooves can be used as marks for mask alignment.

Figure 5C:
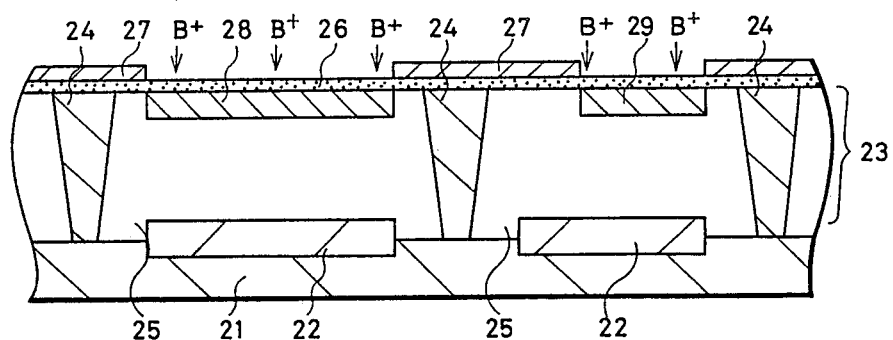

Referring to FIG. 5C, a first resist pattern 27 is formed on the thin oxide layer 26. Using the first resist pattern 27 as a mask, boron is selectively introduced by first ion implantation into the surface layer of the epitaxial layer 23 through the thin oxide layer 26 to form a resistor region 28 and a base region 29.

Figure 5D:
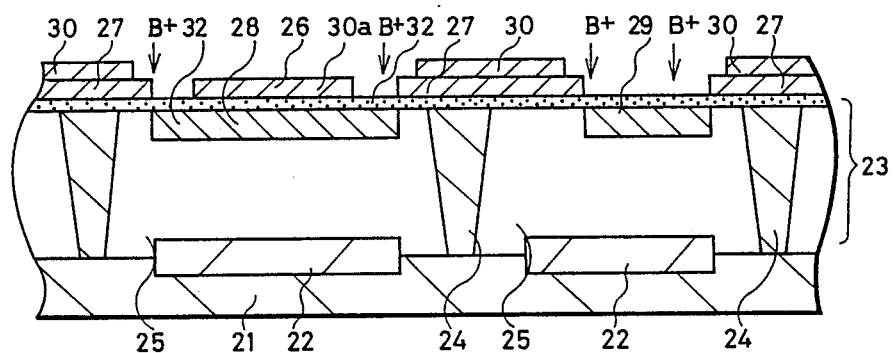

Referring to FIG. 5D, second resist pattern 30, 30a is formed on the first resist pattern 27. Using the first and second resist patterns as masks, boron is introduced by second ion implantation into the base region 29 and the contact portions 32 at both ends of the resistor region 28 through the thin oxide layer 26. The ion implantation through the thin oxide layer 26 involves less crystal defects as compared with the case of implanting ions directly to the exposed surface of the epitaxial layer. In addition, the thin oxide layer does not require an expensive apparatus such as an ion reactive etching apparatus used for etching a thick oxide layer with high precision to form openings.

Figure 5E:
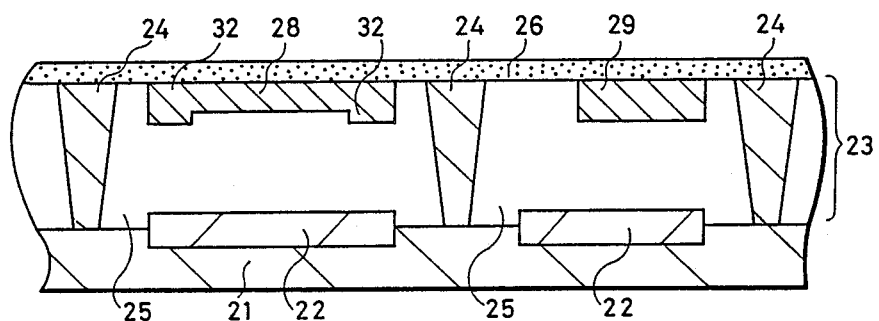

Referring to FIG. 5E, the first and second resist patterns 27, 30 and 30a are removed and the thickness of the oxide layer 26 is increased to about several thousands Å by a CVD process or the like under the normal pressure. After that, the impurities in the base region 9 is diffused to a predetermined depth by a heat treatment at about 1000° C. in a non-oxidizing atmosphere. At this time, since a smaller quantity of ions are implanted in the resistor region 28 than that in the base region 28 and the contact region 32, the diffusion depth of the resistor region 28 becomes shallower. In this heat treatment, the CVD oxide layer 26 is annealed simultaneously. If the thickness of the oxide layer 26 is increased by the CVD process not by thermal oxidation, the impurity concentration in the surface layer of the base region 27 is little lowered. Accordingly, the impurity concentration can be accurately controlled to enable the base region to have a resistance value of 200 to 400 $\Omega/\square$ and thus the current amplification factor $h_{FE}$ can be more accurately controlled.

Thereafter, the steps shown in FIGS. 2G and 2F are executed to complete fabrication of the semiconductor IC.

Figure 6A:
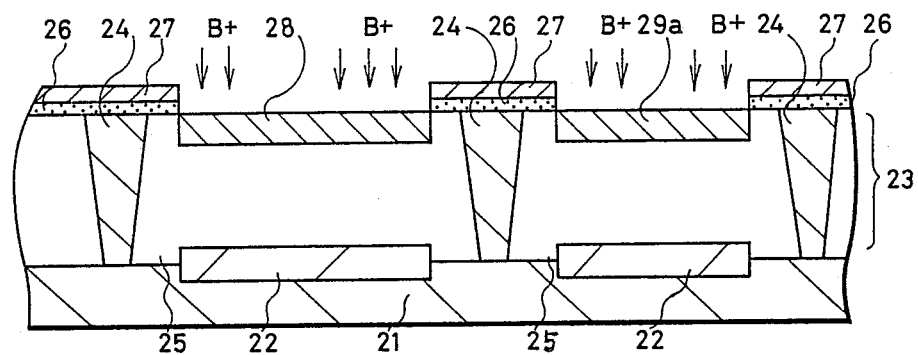
FIGS. 6A to 6C are sectional views illustrating a still further embodiment of the invention.
Figure 6B:
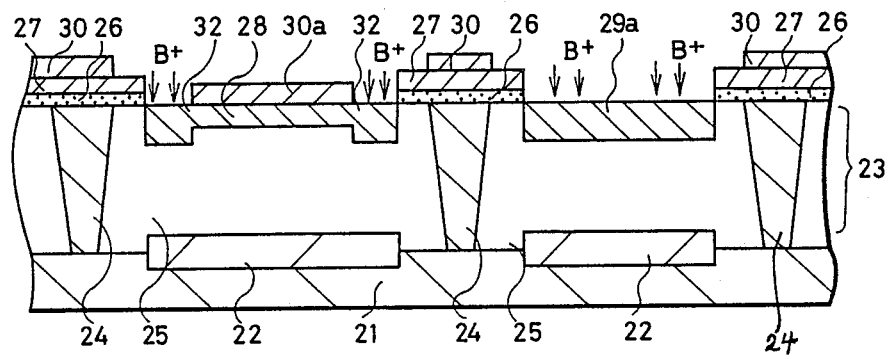
Figure 6C:
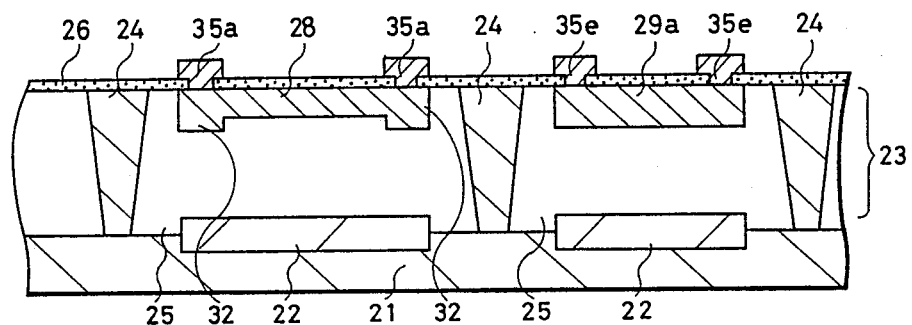

FIGS. 6A to 6C illustrate a still further embodiment of the present invention.

FIG. 6A represents a state corresponding to FIG. 2D. However, in FIG. 6A, a second resistor region 29a is formed in place of the base region 29 by the first ion implantation of boron by which the first resistor region 28 is also formed. If desired, the first and second resistor regions 28 and 29a may be formed in different areas on the same island. The dose of boron ions and the voltage for acceleration thereof suited for the first resistor region 28 having a relatively high resistance value are selected in the first ion implantation.

Referring to FIG. 6B, second resist patterns 30, 30a is formed on the first resist pattern 27 and the epitaxial layer 23. Using the second resist pattern 30, 30a the first resist pattern 27 as masks, boron ions are introduced into the second resistor region 29a and the contact portions 32 at both ends of the first resistor region 28 by second ion implantation. In the second ion implantation, the dose and the voltage for acceleration of boron ions are selected to obtain an impurity concentration suited for the second resistor 29a having a relatively low resistance value. The impurity concentration suited for the second resistor 29a having the low resistance value is an impurity concentration sufficient for the contact regions 32 of the first resistor 28 having the high resistance value to form ohmic contact with metal electrodes. In other words, the second resistor 29a has an impurity concentration in its whole region, sufficient for forming ohmic contact with the metal electrodes.

After that, the first and second resist patterns 27, 30 and 30a are removed and the whole surface of the epitaxial layer 23 is covered with an oxide layer 26 by a thermal oxidation or CVD process, and further, the implanted impurity ions are diffused to a predetermined depth by a heat treatment.

Referring to FIG. 6C, the oxide layer 26 is patterned. The patterned film 26 and its openings are covered with an aluminum layer deposited by evaporation or sputtering. This aluminum layer is patterned to form electrodes 35a on the contact regions 32 of the first resistor 28 and electrodes 35e on both end portions of the second resistor 29a through respective contact holes of the oxide layer 26.

According to this embodiment, two kinds of resistors having different resistance values are formed simultaneously, which makes it possible to simplify the manufacturing process and to reduce the manufacturing cost.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating a semiconductor integrated circuit comprising the steps of:
    preparing a semiconductor substrate of a first conductivity type,
    forming buried layers of a second conductivity type opposite to the first conductivity type in predetermined regions of said semiconductor substrate,
    forming an epitaxial layer of the second conductivity type covering said substrate and said buried layers,
    forming isolation regions of the first conductivity type dividing said epitaxial layer into a plurality of islands,
    selectively implanting ions to form a base region of the first conductivity type of a vertical bipolar transistor in a surface layer of one island and simultaneously to form a resistor region in a surface layer of another island, said selectively implanting including effecting a first ion implantation and a second ion implantation,
    selectively doping impurities of the first conductivity type during the first ion implantation into not only the resistor region but also the base region of the vertical bipolar transistor thereby determining impurity concentration in said resistor region,
    further selectively doping impurities of the first conductivity type during the second ion implantation into said base region thereby determining an impurity concentration in said base region,
    causing the impurities doped during the first and second ion implantation to be diffused to a prescribed depth in said base region, and
    selectively diffusing impurities of the second conductivity type into a surface layer of said base region, to form an emitter region of the vertical bipolar transistor.

2. The method of claim 1, wherein impurity concentration of both end portions of said resistor region is increased during said second ion implantation so that contact regions for said resistor are formed.

3. The method of claim 1, further comprising the steps of:
    covering the whole surface of said epitaxial layer with a CVD oxide layer after ions have been implanted in said base region and said resistor region, and thereafter applying a heat treatment to diffuse impurities in the base region to a predetermined depth.

4. The method of claim 3, wherein
the heat treatment for diffusing the impurities in the base region is carried out in a non-oxidizing atmosphere.

5. A method of fabricating a semiconductor integrated circuit comprising the steps of:
preparing a semiconductor substrate of a first conductivity type,
forming buried layers of a second conductivity type opposite to the first conductivity type in predetermined regions of said semiconductor substrate,
forming an epitaxial layers of the second conductivity type covering said substrate and said buried layers,
forming isolation regions of the first conductivity type dividing said epitaxial layer into a plurality of islands,
forming an insulator film on said epitaxial layer,
forming a first resist pattern on said insulator film,
selectively etching said insulator film by using said first resist pattern as a mask, thereby to form an insulator film pattern,
selectively introducing impurities of the first conductivity type to form a base region of a vertical bipolar transistor and a resistor region simultaneously by effecting a first ion implantation using at least said insulator film pattern as a mask, thereby determining an impurity concentration in said resistor,
further forming a second resist pattern over said insulator film pattern,
further selectively introducing impurities of the first conductivity type into at least said base region by effecting a second ion implantation using at least said insulator film pattern and said second resist pattern as masks, thereby determining an increased impurity concentration of said base region which is greater than that of said resistor region,
diffusing the impurities introduced by said first and second ion implantation in the base region to a predetermined depth, and
selectively diffusing impurities of the second conductivity type into a surface layer of the base region, thereby to form an emitter region of the vertical bipolar transistor.

6. The method of claim 5, wherein
impurity concentrations of both end portions of said resistor region are also increased by said second ion implantation, thereby to form contact regions for said resistor region.

7. The method of claim 5, wherein
said first resist pattern remains at the time of said first ion implantation.

8. The method of claim 7, wherein
said first resist pattern remains at the time of said second ion implantation.

9. A method of fabricating a semiconductor integrated circuit comprising the steps of:
preparing a semiconductor substrate of a first conductivity type,
forming buried layers of a second conductivity type opposite to the first conductivity type in predetermined regions of said semiconductor substrate,
forming an epitaxial layer of the second conductivity type covering said substrate and said buried layers,
forming, by thermal diffusion, isolation regions of the first conductivity type dividing said epitaxial layer into a plurality of islands,
removing a thick oxide layer formed unavoidably on said epitaxial layer at the time of forming said isolation regions, exposing said epitaxial layer, and then forming another thin thermal oxide layer on said epitaxial layer,
selectively doping impurities of the first conductivity type by effecting a first ion implantation through said thin oxide layer into a resistor region in a surface layer of one island and simultaneously into a base region of a vertical bipolar transistor in a surface layer of another island, thereby determining an impurity concentration in said resistor region,
further selectively doping impurities of the first conductivity type by effecting a second ion implantation into at least said base region, thereby determining an increased impurity concentration of said base region which is greater than that of said resistor region,
diffusing impurities doped by said first and second ion implantations in said base region to a predetermined depth by a heat treatment, and
selectively diffusing impurities of the second conductivity type in a surface layer of said base region, to form a n emitter region to the vertical bipolar transistor at a predetermined depth.

10. A method of fabricating a semiconductor integrated circuit comprising the steps of:
preparing a semiconductor substrate of a first conductivity type,
forming buried layers of a second conductivity type opposite to the first conductivity type in predetermined regions of said semiconductor substrate,
forming an epitaxial layer of the second conductivity type covering said substrate and said buried layers,
forming isolation regions of the first conductivity type dividing said epitaxial layer into a plurality of islands,
forming an insulator film on said epitaxial layer,
forming a first resist pattern on said insulator film,
selectively implanting impurities of the first conductivity type by effecting a first ion implantation to form both first and second resistor regions, thereby determining an impurity concentration in said first resistor region,
further forming a second resist pattern covering at least a portion of said first resistor region so as to maintain the impurity concentration of said first resistor region,
further selectively implanting impurities of the first conductivity type into at least said second resistor region by effecting a second ion implantation using at least said insulator film pattern and said second resist pattern as masks, thereby determining an increased impurity concentration of said second resistor region which is greater than that of said first resistor region, and
diffusing impurities implanted by said first and second ion implantations in said second resistor region to a predetermined depth by a heat treatment.

11. The method of claim 10, wherein
impurity concentrations at both end portions of said first resistor region 19 are also increased in said second ion implantation, to form contact regions for said first resistor region.

12. The method of claim 10, wherein
said first resist pattern remains at the time of said first ion implantation.

13. The method of claim 11, wherein
said first resist pattern remains at the time of said second ion implantation.

* * * * *